(12) United States Patent  
Chen et al.

(10) Patent No.: US 10,153,180 B2  
(45) Date of Patent: Dec. 11, 2018

(54) SEMICONDUCTOR BONDING STRUCTURES AND METHODS

(71) Applicant: Taiwan Semiconductor Manufacturing Company, Ltd., Hsin-Chu (TW)

(72) Inventors: Meng-Tse Chen, Changzhi Township (TW); Hsiu-Jen Lin, Zhubei (TW); Wei-Hung Lin, Xinfeng Township (TW); Kuei-Wei Huang, Hsinchu (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/044,504

(22) Filed: Oct. 2, 2013

(65) Prior Publication Data

US 2015/0091193 A1 Apr. 2, 2015

(51) Int. Cl.  
*H01L 21/56* (2006.01)  
*H01L 23/00* (2006.01)

(52) U.S. Cl.  
CPC ............ *H01L 21/563* (2013.01); *H01L 24/97* (2013.01); *H01L 2224/16225* (2013.01); *H01L 2924/12042* (2013.01); *H01L 2924/15311* (2013.01); *H01L 2924/15787* (2013.01); *H01L 2924/181* (2013.01)

(58) Field of Classification Search  
CPC ... H01L 21/563; H01L 23/3157; H01L 24/97; H01L 2924/12042; H01L 2924/181; H01L 2924/15787; H01L 2224/16225; H01L 2924/15311

USPC .......................................................... 257/778  
See application file for complete search history.

(56) References Cited

U.S. PATENT DOCUMENTS

| | | | | |
|---|---|---|---|---|
| 5,341,564 | A * | 8/1994 | Akhavain | H01L 23/13 174/557 |
| 6,190,940 | B1 * | 2/2001 | DeFelice | H01L 21/563 257/737 |
| 6,365,423 | B1 * | 4/2002 | Heinlein et al. | 438/14 |
| 6,614,122 | B1 * | 9/2003 | Dory | H01L 21/563 257/783 |
| 2004/0050911 | A1 * | 3/2004 | Lee | 228/180.22 |
| 2004/0169275 | A1 * | 9/2004 | Danvir | H01L 21/563 257/737 |
| 2005/0012208 | A1 * | 1/2005 | Jang | H01L 21/563 257/730 |
| 2006/0046346 | A1 * | 3/2006 | Benson | H01L 21/563 438/106 |

(Continued)

OTHER PUBLICATIONS ("Reflow Soldering Process Considerations for Surface Mount Application" www.kemet.com—Oct. 1997) by Bergenthal.*

*Primary Examiner* — Marc Armand  
*Assistant Examiner* — Sue Tang  
(74) *Attorney, Agent, or Firm* — Slater Matsil, LLP (57) ABSTRACT

A system and method for applying an underfill is provided. An embodiment comprises applying an underfill to a substrate and patterning the underfill. Once patterned other semiconductor devices, such as semiconductor dies or semiconductor packages may then be attached to the substrate through the underfill, with electrical connections from the other semiconductor devices extending into the pattern of the underfill.

17 Claims, 4 Drawing Sheets

(56) References Cited

U.S. PATENT DOCUMENTS

| | | | |
|---|---|---|---|
| 2007/0284758 A1* | 12/2007 | Zhang | H01L 21/563 |
| | | | 257/780 |
| 2011/0048778 A1* | 3/2011 | Han et al. | 174/260 |
| 2012/0153457 A1* | 6/2012 | Shimizu | H01L 23/3128 |
| | | | 257/734 |
| 2014/0057411 A1* | 2/2014 | Hoang | H01L 21/78 |
| | | | 438/460 |

* cited by examiner

SEMICONDUCTOR BONDING STRUCTURES AND METHODS

BACKGROUND

Generally, semiconductor devices do not work in isolation with other devices. Rather, the devices are both physically and electrically connected to each other in order to send power connections, ground connections, and signals from one device to another device so that the devices can work in tandem with each other to performed the desired functions. Such electrical and physical connecting of semiconductor devices are generally referred to as bonding the semiconductor devices together.

However, the process of bonding two semiconductor devices together is more complicated than simply contacting the two physical structures together. Rather, each semiconductor device has different characteristics, such as different generations of heat, different coefficients of thermal expansions, or the like. As such, semiconductor devices that have been bonded together will have different internal stresses and strains which may also generate stresses and strains between the different devices.

As such, an underfill material may be used to help protect the different semiconductor devices from the stresses and strains caused by the bonding of the different semiconductor devices. The underfill material will also help protect the devices from various environmental hazards that may occur. However, advancements are still needed in the manufacturing and use of the underfill so as to help provide the best and most efficient protection for the semiconductor devices.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely bonding semiconductor devices to each other. Other embodiments may also be applied, however, to other types of bonding.

With reference now to FIG. 1, there is shown a substrate 101 with an underfill 103 applied to the substrate 101. In an embodiment the substrate 101 is a semiconductor wafer that comprises a semiconductor substrate with electronic devices formed therein and/or thereon and can also, but not necessarily, include dielectric and conductive layers to provide connectivity and routing between the electronic devices. There could be any number of alternating layers of conductive and dielectric layer located on the semiconductor substrate, but a typical range of layers would be from three layers to twelve layers of alternating conductive and dielectric layers. The semiconductor wafer may also be separated into a plurality of individual semiconductor dies that remain connected to each other within the semiconductor wafer and are separated by scribe lines between individual ones of the semiconductor dies.

However, the substrate 101 is not intended to be limited to a semiconductor substrate as described above. Rather, any suitable substrate, such as ceramic substrates, polymer substrates, interposers, or any other type of substrate to which semiconductor dies or packages may be physically and electrically connected may also be utilized. All such substrates are fully intended to be included within the scope of the embodiments.

The underfill 103 is placed onto the substrate 101 in order to help protect the substrate 101 and first semiconductor dies 105 (not illustrated in FIG. 1A but illustrated and described below with respect to FIG. 1C) from stresses and the environment after the substrate 101 and the first semiconductor dies 105 have been bonded together. In an embodiment the underfill 103 is an epoxy material that may be placed onto the substrate 101 in a solid state so that is can be patterned, such as by using a lamination process, a coating process or other suitable dispensing process. Alternatively, the underfill 103 may be a molding compound, benzocyclobutent (BCB), with or without fillers.

In an alternative embodiment, the underfill 103 may be dispensed in a liquid state and then partially cured, but not fully cured, prior to patterning. For example, the underfill 103 may be cured up to a point but can still be crosslinked with, e.g., first semiconductor dies 105 (not illustrated in FIG. 1A but illustrated and described below with respect to FIG. 1C).

Figure 1A:
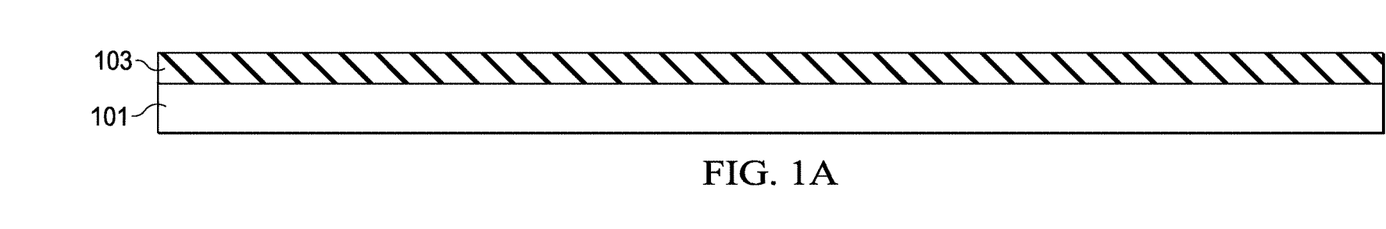
FIGS. 1A-1D illustrate a patterned underfill in a bump on trace bonding configuration in accordance with an embodiment.
Figure 1B:
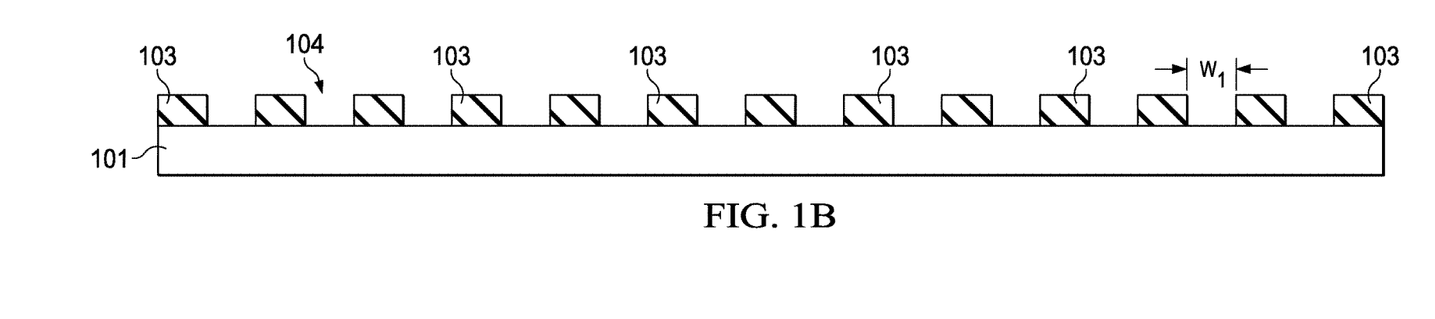

FIG. 1B illustrates a patterning of the underfill 103 in order to form first openings 104 to connect the substrate 101 to other devices, such as the plurality of first semiconductor dies 105 (not illustrated in FIG. 1B but illustrated and discussed below with respect to FIG. 1C). In an embodiment the underfill 103 may be patterned using a photolithographic masking and etching process. In such a process a photosensitive material (not illustrated) is applied to the underfill 103 and exposed to a patterned energy (e.g., light) in order to induce a chemical reaction within those portions of the photosensitive material that were illuminated. The chemical reaction changes a physical property (e.g., polarity) of the illuminated section, and the difference in properties may then be utilized to selectively separate the illuminated portions from the non-illuminated portions using, e.g., a developer. Once the photosensitive material has been patterned, the photosensitive material may be used as a mask to pattern the underfill 103, and then the photosensitive material may be removed using a process such as ashing. In an embodiment the first openings 104 may have a first width $W_1$ of between about 10 µm to about 100 µm, such as about 20 µm, and a ratio between the critical dimension (the smallest width of a line or the smallest space between two lines permitted in the fabrication of the device as measured along a width of the first openings 104) of the first openings 104 and the thickness of the underfill 103 may be about 1:1.

However, a photolithography process such as the one above is intended to be an illustrative embodiment and is not intended to limit the embodiments in any fashion. Rather, any suitable process for patterning the underfill 103, such as laser drilling or even a mechanical process, may alternatively be utilized. All such processes are fully intended to be included within the scope of the embodiments.

Figure 1C:
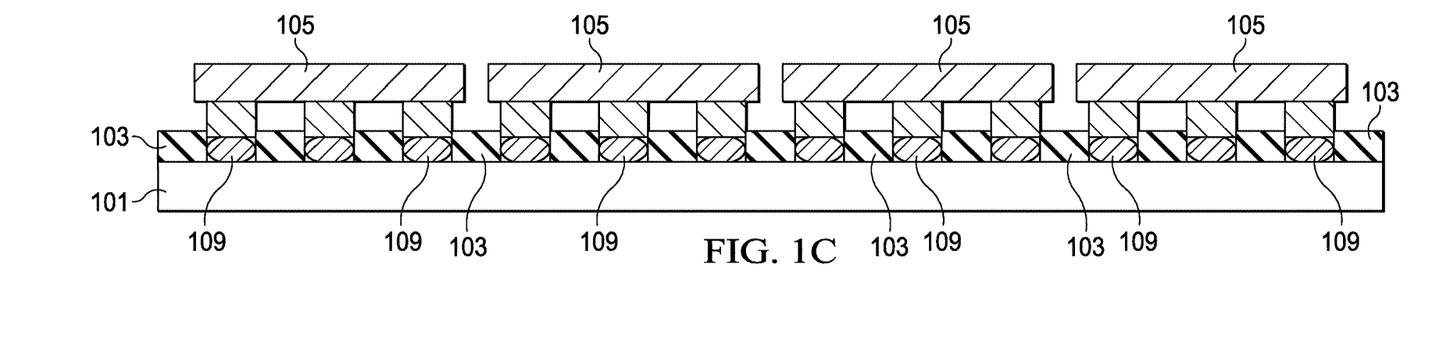

FIG. 1C illustrates a placement of a plurality of first semiconductor dies 105 onto the substrate 101. In an embodiment the plurality of first semiconductor dies 105 may comprise a plurality of active devices and metallization layers (not individually illustrated) and may also comprise first external connectors 109 such as solder bumps. In an embodiment in which the first external connectors 109 are a tin solder material, the first external connectors 109 may be formed by initially forming a layer of tin through any suitable method such as evaporation, electroplating, printing, solder transfer, etc, to a preferred thickness of about 30 µm and to a width that is complementary to the first openings 104. Once a layer of tin has been formed on the structure, a reflow is preferably performed in order to shape the material into the desired bump shape.

To place the first semiconductor dies 105 onto the substrate 101, the first external connectors 109 are aligned with the first openings 104 previously formed in the underfill 103. Once aligned, the first semiconductor dies 105 and the substrate 101 are brought together such that the first external connectors 109 enter into the first openings 104 and extend to the substrate 101 to make electrical and physical contact with the substrate 101.

Figure 1D:
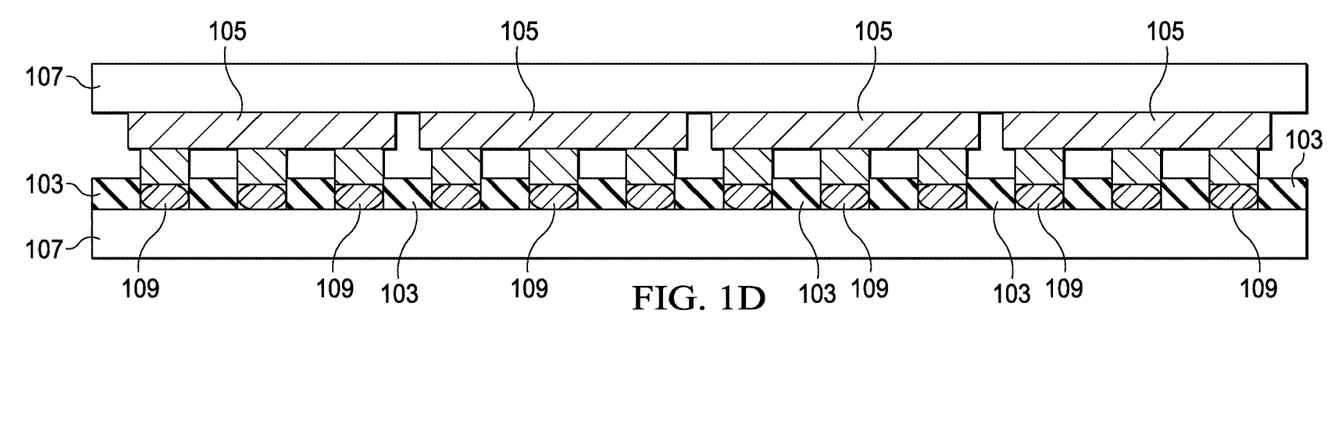

FIG. 1D illustrates a bonding process utilized to physically join the first semiconductor dies 105 to the substrate 101. In an embodiment the bonding process is a thermal compression bonding process, whereby the substrate 101 and the first semiconductor dies 105 are placed between two plates 107 and heat and force are applied to physically bond the first semiconductor dies 105 and the substrate 101. In such a technique the first semiconductor dies 105 and the substrate 101 are heated to a temperature greater than about 150° C., such as about 350° C., while a pressure of between about 1 Mpa and about 100 Mpa, such as about 20 Mpa, is applied.

Alternatively, in an embodiment in which the first external connectors 109 are solder, the bonding process may be a reflow process. In this process the first semiconductor dies 105 and the substrate 101 are placed between the two plates 107 and the temperature of the first external connectors 109 is raised to a suitable temperature such that the solder will reflow. This reflow will bond the first external connectors 109 to the substrate 101.

In yet another example, the bonding process may be a near infrared (NIR) reflow process. In such a process one of the plates 107 (e.g., the plate 107 adjacent to the first semiconductor dies 105) is transparent to near infrared radiation. Then, once the first semiconductor dies 105 and the substrate 101 have been placed between the two plates 107, near infrared radiation may be directed through the plate 107 to the first external connectors 109, causing the first external connectors to reflow and bond the first semiconductor dies 105 to the substrate 101.

Once the first semiconductor dies 105 have been bonded to the substrate 101, a thermal process may be utilized such that the underfill 103 may be cured in order to harden it and provide additional protection to the first semiconductor dies 105 and the substrate 101. In an embodiment the thermal process may be performed by placing the underfill 103 (along with the substrate 101 and the first semiconductor dies 105) into a furnace or other device in order to raise the temperature of the underfill 103 so as to cure the underfill. For example, in an embodiment in which the underfill 103 is an epoxy, the underfill 103 may be cured at a temperature of between about 100° C. and about 200° C., such as about 150° C., for a time of between about 5 hours and about 1 hour, such as about 2 hours.

By using a patterned underfill 103 along with collective bonding, any shifting of dies during the collective bonding process can be minimized, thereby helping with alignment. This can also prevent any bridging of joints, and helps to prevent any debris, filler, or epoxy from interfering with the joint surfaces of the connections. All of this allows for an easier time and curing control of the underfill 103

Figure 2A:
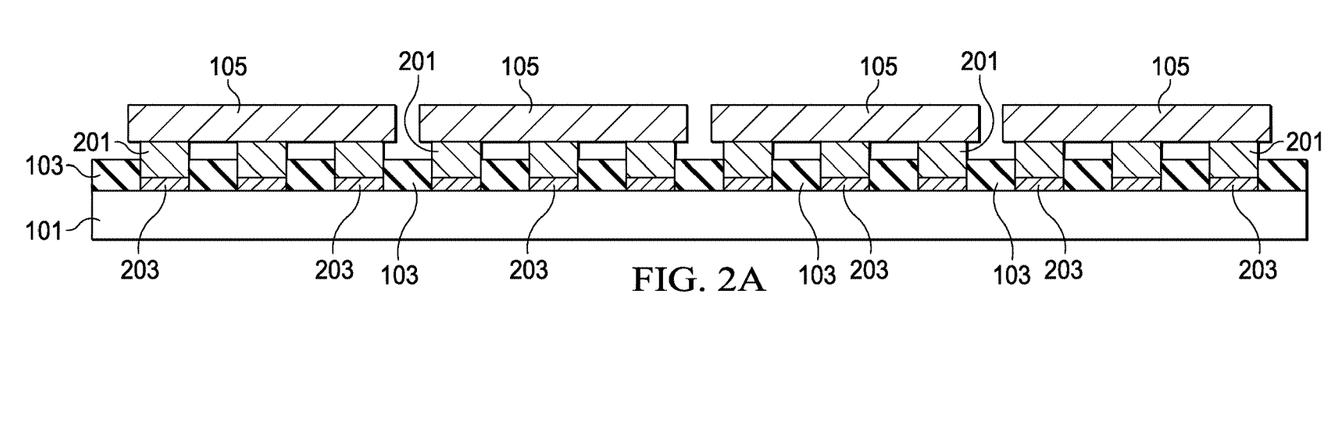
FIGS. 2A-2B illustrate a patterned underfill in a lead-free bonding configuration in accordance with an embodiment.

FIG. 2A illustrates another embodiment in which a patterned underfill 103 is utilized for bonding semiconductor devices together. In this embodiment the first semiconductor dies 105, instead of having solder bumps, utilize a lead free material on the first semiconductor dies 105, such as conductive pillars 201. In an embodiment the conductive pillars 201 may be formed by initially forming and patterning a photoresist (not shown) over the first semiconductor dies 105. The conductive pillars 201 may be formed within the pattern of the photoresist by first forming a seed layer (not shown) and then forming the conductive pillars 201 using the seed layer as an initiator. The conductive pillars 201 may be formed from a conductive material such as copper, although other conductive materials such as nickel, titanium (Ti), vanadium (V), or aluminum (Al), combinations of these, and the like may also be used. Additionally, the conductive pillars 201 may be formed using a process such as electroplating, by a combination of current and immersion within a solution deposit, e.g., copper within the openings in order to fill and/or overfill the openings of the photoresist, thereby forming the conductive pillar. After the conductive pillars 201 have been formed, the photoresist may be removed.

On the substrate 101, the underfill 103 may be placed and patterned as described above with respect to FIG. 1B. However, once the underfill 103 has been patterned, a conductive material 203 may be placed within the first openings 104 in order to provide a contact for the conductive pillars 201 during bonding. In an embodiment the conductive material 203 is solder and may be placed within the first openings 104 using a process such as plating, although any suitable process may alternatively be used, and the conductive material 203 can have a thickness of between about 1 µm and about 20 µm, such as about 5 µm.

Figure 2B:
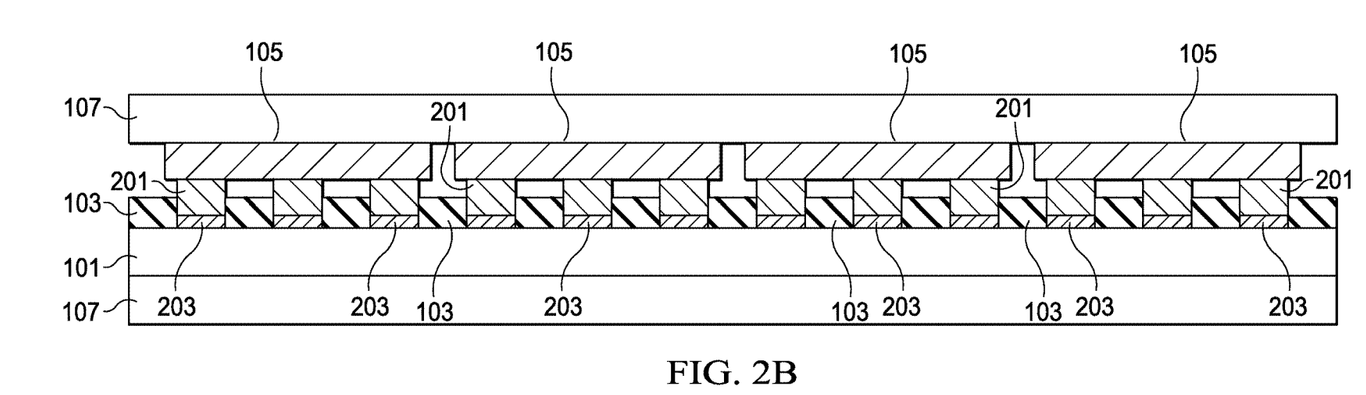

FIG. 2B illustrates that, once the conductive pillars 201 have been formed, the first semiconductor dies 105 may be aligned with the first openings 104 and the first semiconductor dies 105 and the substrate 101 may be brought together. Once together, the first semiconductor dies 105 and the substrate 101 may be bonded together using, e.g., thermal compression bonding, a reflow process, or an NIR reflow process, as described above with respect to FIG. 1D, although any suitable bonding process may alternatively be utilized.

Figure 3A:
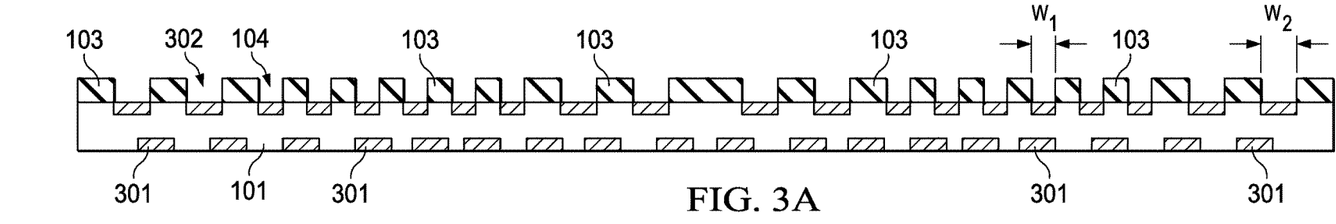
FIGS. 3A-3D illustrate a patterned underfill in a hybrid bonding configuration in accordance with an embodiment.

FIG. 3A illustrates an embodiment in which a patterned underfill 103 is utilized in a hybrid bonding configuration. In the particular embodiment illustrated in FIG. 3A, the substrate 101 is bonded to both the first semiconductor dies 105 in, e.g., a bump on trace (BOT) configuration and is also bonded to first packages 303 (not illustrated in FIG. 3A but illustrated and described below with respect to FIG. 3C) in, e.g., a package on package (PoP) configuration. In this embodiment the substrate 101 is a package substrate that has a plurality of contact pads 301 on multiple sides of the substrate 101. The contact pads 301 may, but not necessarily, be connected to each other through the use of through substrate vias (TSVs, not individually illustrated in FIG. 3A).

The contact pads 301 are formed in order to provide external contacts for the substrate 101. The contact pads 301 are formed of a conductive material such as aluminum, although other suitable materials, such as copper, tungsten, or the like, may alternatively be utilized. The contact pads 301 may be formed using a process such as CVD, although other suitable materials and methods may alternatively be utilized. Once the material for the contact pads 301 has been deposited, the material may be shaped into the contact pads 301 using, e.g., a photolithographic masking and etching process.

In this embodiment the underfill 103 is placed onto the substrate 101 in a suitable method, such as the method described above with respect to FIG. 1A. However, once the underfill 103 has been placed, the underfill 103 is patterned in order to accommodate both the first semiconductor dies 105 and the first packages 303. For example, while the precise dimensions will depend at least in part on the precise devices to be attached to the substrate 101, in an embodiment, the underfill 103 may be patterned to have the first openings 104 (as described above with respect to FIG. 1B), and may also be patterned (either simultaneously or sequentially) to have second openings 302 sized to receive the first packages 303. In an embodiment, the second openings have a second width $W_2$ of between about 50 μm and about 400 μm, such as about 300 μm.

Figure 3B:
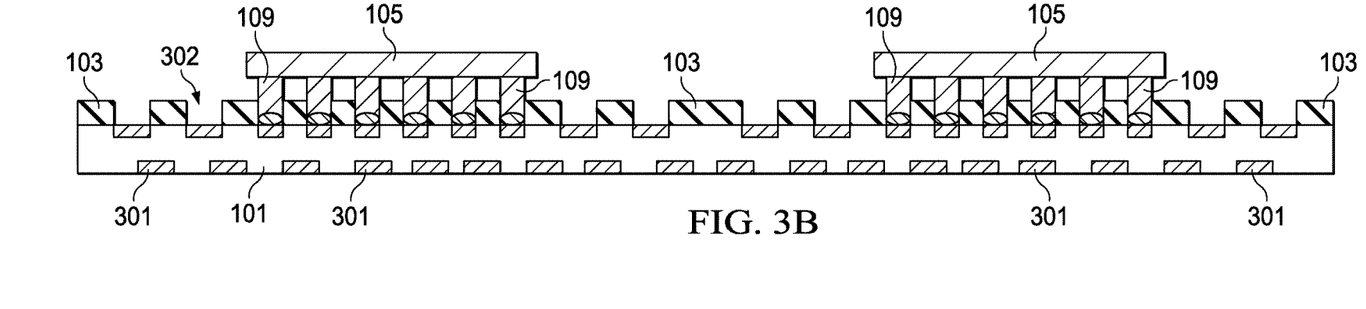

FIG. 3B illustrates a placement of the first semiconductor dies 105 onto the substrate 101, with the first external connectors 109 extending through the first openings 104 to make physical and electrical contact with the contact pads 301 on the substrate 101. Once the first semiconductor dies 105 have all been placed onto the substrate 101, the first semiconductor dies 105 may be collectively bonded to the substrate 101 using a method such as thermal compression bonding (as described above with respect to FIG. 1D), or any other suitable method such as reflowing or NIR reflowing.

However, by patterning the underfill 103 prior to the connection of the first semiconductor dies 105, the underfill 103 remains relatively sturdy and will not be forced (by the first semiconductor dies 105 and the pressure applied) into the surrounding regions. By staying in its place, the underfill 103 will not contaminate other connections, such as the connections exposed by the second openings 302, and reducing overall bond head contamination.

Figure 3C:
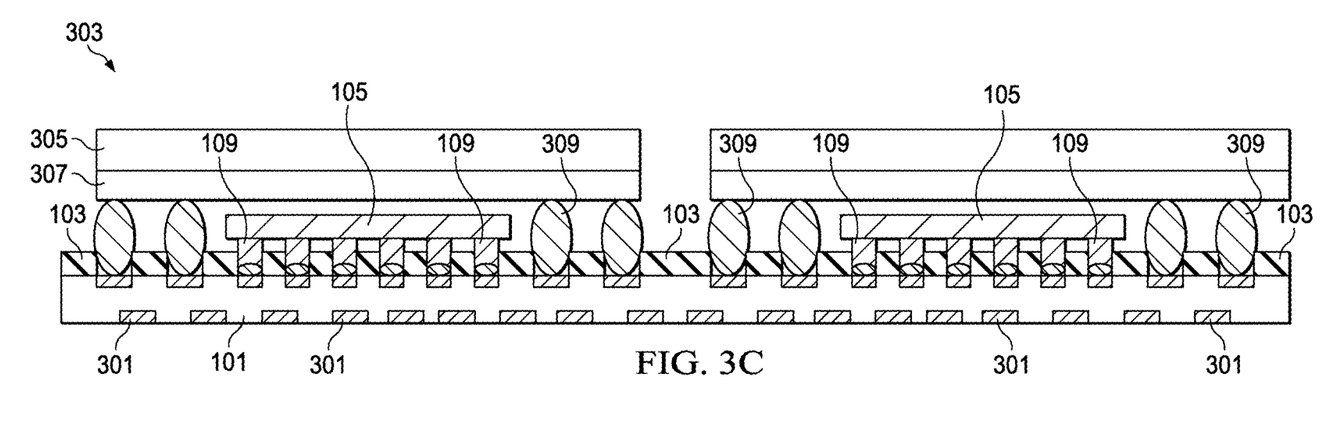

FIG. 3C illustrates that, once the first semiconductor dies 105 have been placed and bonded, the first packages 303 may be placed and bonded onto the substrate 101. In an embodiment the first packages 303 are packages that comprise a semiconductor device that has been placed into a package for protection and connectivity. In an embodiment the first packages 303 comprise a package substrate 305, a redistribution layer 307 over the package substrate 305, and second external connectors 309.

The package substrate 305 may be, e.g., a silicon substrate, doped or undoped, or an active layer of a silicon-on-insulator (SOI) substrate, used to provide support for the first package 100 along with a semiconductor device that has been packaged. However, the package substrate 305 may alternatively be a ceramic substrate, a polymer substrate, an interposer, or any other substrate that may provide a suitable protection and/or fan-out structure that may be desired. These and any other suitable materials may alternatively be used for the package substrate 305.

The redistribution layers 307 are formed on one side of the first packages 303 in order to route electrical connectivity from the package substrate 305 to the second external connectors 309. Additionally, while illustrated in FIG. 3C as a single layer on each one of the first packages 303 for clarity, the redistribution layers 307 are, rather, a series of conductive elements that route electrical signals to individual ones of the second external connectors 309. In an embodiment the redistribution layers 307 are formed using methods for forming interconnect lines in integrated circuits. In an embodiment, the redistribution layers 307 comprise at least one conductive layer formed of a metal such as aluminum, copper, tungsten, titanium, and combinations thereof. The at least one conductive layer may be formed by plating the metal on a seed layer and then etching the undesired portions, leaving the at least one conductive layer, which may have a thickness of between about 2 μm and about 30 μm, with a preferred width of about 5 μm. Once the at least one conductive layer has been formed, a dielectric material may be formed over the at least one conductive layer, and vias may be formed through the dielectric material to provide electrical access to the at least one conductive layer (e.g., for the second external connectors 309). However, other materials and process, such as a well-known damascene process, could alternatively be used to form the redistribution layers 307.

However, as one of skill in the art will recognize, the redistribution layers 307 could be a single layer of conductive material or else could alternatively be multiple layers of conductive material, depending upon the properties desired. For example, the redistribution layers 307 as formed above may be plated with another conductive material such as gold or chromium to provide good adhesion for a subsequently formed connector (described below). This plating could be done through a process such as CVD.

The second external connectors 309 are formed to the redistribution layers 307 and provide electrical connections between the redistribution layers 307 (and, therefore, the package substrate 305) and the substrate 101 once the first packages 303 have been bonded to the substrate 101. In an embodiment the second external connectors 309 are solder balls and may comprise a tin solder material. In such an embodiment the first external connectors 109 may be formed by initially forming a layer of tin through any suitable method such as evaporation, electroplating, printing, solder transfer, etc, to a preferred thickness of about 30 μm and to a width that is complementary to the second openings 302. Once a layer of tin has been formed on the structure, a reflow is preferably performed in order to shape the material into the desired bump shape.

To place the first packages 303, the second external connectors 309 are aligned with the second openings 302 and the second external connectors 309 are put into contact with the substrate 101. Once in physical contact, the first packages 303 may then be collectively bonded to the substrate 101 using a process such as thermal compression bonding, a reflow process, or a NIR reflow process (similar to the processes described above with respect to FIG. 1D), although any other suitable bonding process may alternatively be used.

Figure 3D:
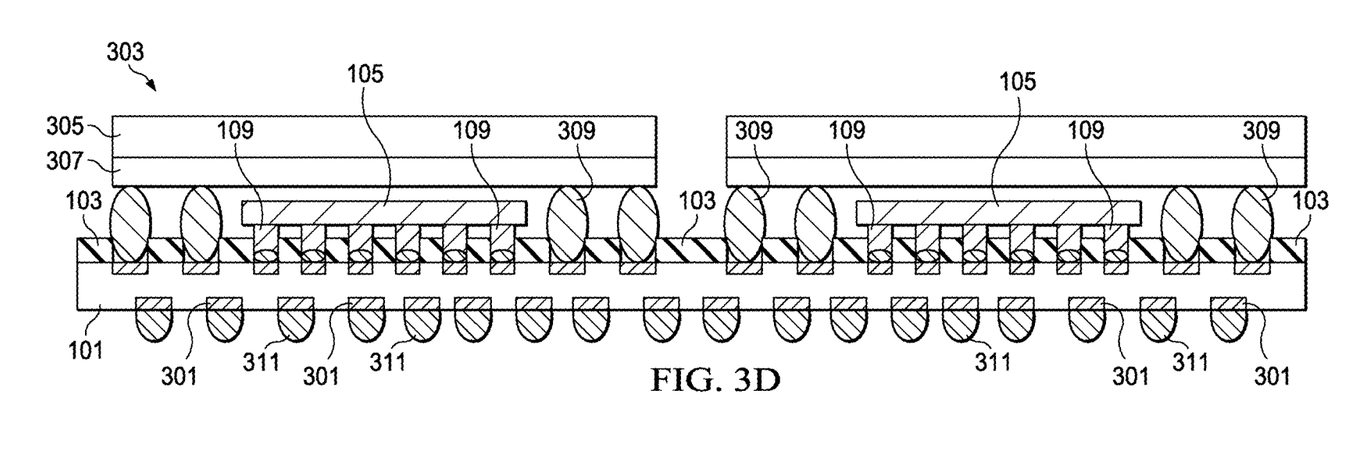

FIG. 3D illustrates the formation of third external connectors 311 to a backside of the substrate 101, along with a singulation of the substrate 101. In an embodiment the third external connectors 311 may be solder balls, such as a tin solder material. In such an embodiment the third external connectors 311 may be formed by initially forming a layer of tin through any suitable method such as evaporation, electroplating, printing, solder transfer, etc, to a preferred thickness of about 30 μm. Once a layer of tin has been formed on the structure, a reflow is preferably performed in order to shape the material into the desired bump shape.

After the third external connectors 311 have been formed, the substrate 101 may be singulated in order to separate the individual devices from each other. In an embodiment the substrate 101 may be singulated using, e.g., a diamond coated saw to cut through the substrate 101. However, physical sawing is only one possible method of singulation, and any other suitable method, such as etching or the like, may alternatively be utilized. All such methods are fully intended to be included within the scope of the embodiments.

In an embodiment, a method of manufacturing a device comprising applying an underfill material to a substrate and patterning the underfill material. A first semiconductor device is bonded to the substrate, at least a portion of the first semiconductor device extending through the underfill material.

In another embodiment, a method of manufacturing a device comprising applying an underfill material onto a substrate and forming a first plurality of openings into the underfill material to expose a first portion of the substrate is provided. After the forming the first plurality of openings, a first electrical contact is placed through one of the first plurality of openings.

In yet another embodiment, a semiconductor device comprising a substrate and an underfill material over the substrate and extending to an outer edge of the substrate, the underfill material having a planar top surface, is provided. A patterned first set of openings is in the underfill material, the first set of openings exposing a portion of the substrate, and a first semiconductor device is over the substrate, the first semiconductor device comprising first connectors that extend through the patterned first set of openings to make physical and electrical contact with the substrate.

Although the present embodiments and their advantages have been described in detail, it should be understood that various changes, substitutions and alterations can be made herein without departing from the spirit and scope of the disclosure as defined by the appended claims. For example, the precise method of bonding may be modified to any suitable method of electrically and physically connecting the various devices together. Additionally, the collective bonding with a patterned underfill may also be used with other bonding configurations, such as chip on wafer (CoW), wafer on wafer (WoW), or the like.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a device, the method comprising:
    applying an underfill material to a substrate;
    partially curing the underfill material while the underfill material is located on the substrate and prior to a placement of a first semiconductor device;
    patterning the underfill material to form first openings after the partially curing the underfill material, wherein a ratio between a critical dimension of the first openings and a thickness of the underfill material is about 1:1;
    bonding the first semiconductor device to the substrate, at least a portion of the first semiconductor device extending through the underfill material, wherein the underfill material maintains its shape from a start of the bonding the first semiconductor device to the substrate to an end of the bonding the first semiconductor device to the substrate and wherein the underfill material prevents shifting of the first semiconductor device; and
    applying heat to the underfill material to fully cure the underfill material and crosslink the underfill material to the first semiconductor device.

2. The method of claim 1, wherein the patterning the underfill material further comprises forming a plurality of openings through the underfill material, the plurality of openings having a same width.

3. The method of claim 1, wherein the bonding the first semiconductor device to the substrate forms a bump on trace connection.

4. The method of claim 1, further comprising bonding a second semiconductor device to the substrate.

5. The method of claim 1, wherein the applying the heat is performed after the bonding the first semiconductor device to the substrate.

6. The method of claim 1, wherein the bonding the first semiconductor device to the substrate comprises a near infrared reflow.

7. The method of claim 1, further comprising singulating the substrate.

8. A method of manufacturing a device, the method comprising:
    applying an underfill material onto a semiconductor wafer, the semiconductor wafer comprising a plurality of semiconductor dies;
    partially curing the underfill material;
    forming a first plurality of openings into the underfill material after the partially curing the underfill material to expose a first portion of the semiconductor wafer, wherein each one of the first plurality of openings has a width of between about 10 μm and about 100 μm and wherein a ratio between a critical dimension of each of the first plurality of openings and a thickness of the underfill material is about 1:1;
    after the forming the first plurality of openings, placing a first electrical contact of a first semiconductor die through one of the first plurality of openings;
    applying heat to the underfill material and the first electrical contact to bond the first electrical contact to the semiconductor wafer, wherein the underfill material maintains its shape during the applying the heat;
    after the applying the heat to the underfill material, placing the underfill material into a furnace and fully curing the underfill material, wherein the underfill material crosslinks with the first semiconductor die; and
    singulating the semiconductor wafer after fully curing the underfill material.

9. The method of claim 8, wherein the forming the first plurality of openings further comprises:
applying a photoresist to the underfill material; and
patterning the underfill material through the photoresist.

10. The method of claim 8, wherein the first electrical contact is a solder bump.

11. The method of claim 8, wherein the applying heat to the underfill material and the first electrical contact to bond the first electrical contact to the semiconductor wafer initiates a reflow of the first electrical contact.

12. The method of claim 11, wherein the bonding the first electrical contact to the semiconductor wafer comprises irradiating the first electrical contact with near infrared radiation.

13. A method of manufacturing a device, the method comprising:
applying an underfill material to a first substrate, the underfill material having a first thickness, the first substrate being a semiconductor wafer with a plurality of semiconductor dies;
partially curing the underfill material after the applying the underfill material;
forming first openings through the underfill material after the partially curing the underfill material to expose portions of the first substrate through the underfill material, wherein a ratio between a critical dimension of the first openings and the first thickness is about 1:1;
aligning contacts located on a second substrate with the first openings, wherein the second substrate is a semiconductor die;
contacting the contacts with conductive regions of the first substrate, wherein after the contacting the contacts extend through the first openings;
bonding the contacts with the conductive regions, wherein the underfill material remains outside of the first openings during the bonding the contacts with the conductive regions;
removing the first substrate and the second substrate from the bonding the contacts and placing the first substrate and the second substrate into a furnace; and
after the placing the first substrate and the second substrate into the furnace, completing a curing of the underfill material after the bonding the contacts by applying heat.

14. The method of claim 13, wherein the contacts comprise solder.

15. The method of claim 14, wherein the bonding the contacts with the conductive regions comprises a reflow process.

16. The method of claim 13, wherein the applying the underfill material further comprises dispensing the underfill material is a liquid state.

17. The method of claim 13, wherein the forming the first openings through the underfill material further comprises:
placing a photosensitive material onto the underfill material;
exposing the photosensitive material to a patterned energy; and
developing the photosensitive material to form a patterned photosensitive material.

\* \* \* \* \*